(12) United States Patent
Sugitatsu et al.

(10) Patent No.: US 7,390,683 B2
(45) Date of Patent: Jun. 24, 2008

(54) METHOD OF MANUFACTURING A SEMICONDUCTOR DEVICE INCLUDING A SLAB LAYER WITH A PERIODIC AIR HOLE STRUCTURE AND A LINEAR DEFECT REGION

(75) Inventors: Atsushi Sugitatsu, Tokyo (JP); Hitoshi Tada, Tokyo (JP); Susumu Noda, Kyoto (JP)

(73) Assignees: Mitsubishi Denki Kabushiki Kaisha, Tokyo (JP); Kyoto University, Kyoto (JP)

( * ) Notice: Subject to any disclaimer, the term of this patent is extended or adjusted under 35 U.S.C. 154(b) by 120 days.

(21) Appl. No.: 11/375,016

(22) Filed: Mar. 15, 2006

(65) Prior Publication Data
US 2006/0157716 A1    Jul. 20, 2006

Related U.S. Application Data

(62) Division of application No. 10/852,180, filed on May 25, 2004, now Pat. No. 7,042,014.

(30) Foreign Application Priority Data

Jul. 25, 2003    (JP)    ............................. 2003-279587

(51) Int. Cl.
*H01L 21/00*    (2006.01)

(52) U.S. Cl. ........................ 438/22; 257/79; 372/46.014; 385/131

(58) Field of Classification Search .................... 438/22; 257/79; 372/43.01–46.01; 385/129–132
See application file for complete search history.

(56) References Cited

U.S. PATENT DOCUMENTS

| | | | | |
|---|---|---|---|---|
| 5,526,449 A | * | 6/1996 | Meade et al. | .................. 385/14 |
| 5,684,817 A | * | 11/1997 | Houdre et al. | ........... 372/45.01 |
| 5,955,749 A | | 9/1999 | Joannopoulos et al. | |
| 6,674,778 B1 | | 1/2004 | Lin et al. | |
| 6,711,200 B1 | * | 3/2004 | Scherer et al. | ................. 372/64 |
| 2003/0141507 A1 | | 7/2003 | Krames et al. | |
| 2004/0062505 A1 | | 4/2004 | Sugitatsu et al. | |

OTHER PUBLICATIONS

Sugitatsu et al. "Room Temperature Lasing Oscillation Of A Two Dimensional Photonic Crystal Slab With Defect Waveguide By Optical Pump." 2002 IEICE Electronics Society Conference, pp. 329-330.

* cited by examiner

*Primary Examiner*—Andy Huynh
(74) *Attorney, Agent, or Firm*—Leydig, Voit & Mayer, Ltd.

(57) ABSTRACT

A semiconductor device has a two-dimensional slab photonic crystal structure in which a substrate supports a sheet-like slab layer including, sequentially stacked, a lower cladding layer, an active layer, and an upper cladding layer. A periodic refractive index profile structure, in surfaces of the stacked layers, introduces a linear defect region that serves as a waveguide. A p-type region and an n-type region in the slab layer define a pn junction surface at a predetermined angle with respect to the surfaces of the stacked layers in the slab layer.

9 Claims, 15 Drawing Sheets

METHOD OF MANUFACTURING A SEMICONDUCTOR DEVICE INCLUDING A SLAB LAYER WITH A PERIODIC AIR HOLE STRUCTURE AND A LINEAR DEFECT REGION

BACKGROUND OF THE INVENTION

1) Field of the Invention

The present invention relates to a semiconductor device that is an optical device used for optical communication and optical information processing and in which an optical control function has been improved by pumping a two-dimensional slab photonic crystal and driving the two-dimensional slab photonic crystal at a current and a method of manufacturing the semiconductor device.

2) Description of the Related Art

An active operation of a conventional optical active device that uses a two-dimensional slab photonic crystal including an active layer is realized by optical pumping (see, for example, "Room Temperature Optical Pumping/Oscillation by 2D Slab Photonic Crystal Waveguide Laser", Atsushi SUGITATE et al, Proceedings of the Electronics Society Conference, the Institute of Electronics, Information, and Communication Engineers, 2002, p. 329)). This literature discloses that, in the two-dimensional slab photonic crystal in which a hole pattern of a two-dimensional triangular lattice is formed in a layer structure, in which the active layer of a multiple quantum well structure made of InGaAsP is put between air cladding layers, and in which a linear defect is introduced into the hole pattern, if a pumping laser light is irradiated from an upper portion of a waveguide constituted by the linear defect, lasing occurs from an edge of the waveguide.

The conventional optical active device has, as disclosed in the above-mentioned literature, following disadvantage. Since electrode formation means is not established, the crystal cannot be pumped by current injection. As a result, the optical active device can operate as an active optical device such as a laser or a modulator only by optical pumping.

SUMMARY OF THE INVENTION

It is an object of the present invention to solve at least the problems in the conventional technology.

A semiconductor device according to an aspect of the present invention includes any one of a two-dimensional slab photonic crystal structure in which a substrate supports a sheet-like slab layer that is formed by sequentially stacking a lower cladding layer, an active layer, and an upper cladding layer and that has a periodic refractive index profile structure formed in surfaces of the stacked layers, the periodic refractive index profile structure introducing a linear defect region serving as a waveguide, a two-dimensional slab photonic crystal structure in which the sheet-like slab layer is stacked on and held by a dielectric layer, and a two-dimensional slab photonic crystal structure in which the sheet-like slab layer having the periodic refractive index profile structure is stacked on and held by a solid semiconductor layer. A a p-type region and an n-type region are formed in the slab layer so that a pn junction surface is formed at a predetermined angle with respect to the surfaces of the stacked layers in the slab layer.

A method of manufacturing a semiconductor device according to another aspect of the present invention includes forming a slab layer on a substrate by sequentially stacking a lower cladding layer, an active layer, and an upper cladding layer; forming a pn junction surface at a predetermined angle with respect to surfaces of the stacked layers in the slab layer; forming an ohmic contact layer for attaching an electrode, on the upper cladding layer; forming a periodic air hole structure introducing a linear defect region serving as a waveguide, on the slab layer and the ohmic contact layer; forming the electrode on the ohmic contact layer in each of a p-type region and an n-type region in the slab layer; removing the ohmic contact layer; and undercutting an interior of the substrate to be hollow so as to form the sheet-like slab layer.

A method of manufacturing a semiconductor device according to still another aspect of the present invention includes forming a slab layer on a substrate by sequentially stacking a lower cladding layer, an active layer, and an upper cladding layer; forming a pn junction surface at a predetermined angle with respect to surfaces of the stacked layers in the slab layer; forming an ohmic contact layer for attaching an electrode, on the upper cladding layer; forming a periodic air hole structure introducing a linear defect region serving as a waveguide, on the slab layer and the ohmic contact layer; forming the electrode on the ohmic contact layer in each of a p-type region and an n-type region in the slab layer; removing the ohmic contact layer; and oxidizing an Al-containing layer in a lower portion or in both an upper portion and a lower portion of the slab layer into a dielectric layer, so as to form a semiconductor slab layer.

A method of manufacturing a semiconductor device according to still another aspect of the present invention includes forming a slab layer on a first substrate by sequentially stacking a lower cladding layer, an active layer, and an upper cladding layer; forming a pn junction surface at a predetermined angle with respect to surfaces of the stacked layers in the slab layer; forming a periodic air hole structure introducing a linear defect region serving as a waveguide, on the slab layer and the ohmic contact layer; removing a lower portion or an upper portion and a lower portion of the slab layer, so as to form a semiconductor slab layer; fusion-connecting a second substrate prepared separately from the first substrate, to the first substrate; and forming the electrode to be in contact with the ohmic contact layer in a p-type region and an n-type region on the second substrate that has been fusion-connected to the first substrate.

A method of manufacturing a semiconductor device according to still another aspect of the present invention includes forming a slab layer on a substrate by sequentially stacking a lower cladding layer, an active layer, and an upper cladding layer; forming an ohmic contact layer for attaching an electrode, on the upper cladding layer; forming a periodic air hole structure introducing a linear defect region serving as a waveguide, on the slab layer and the ohmic contact layer; forming a pn junction surface at a predetermined angle with respect to surfaces of the stacked layers in the slab layer; forming the electrode on the ohmic contact layer in each of a p-type region and an n-type region in the slab layer; removing the ohmic contact layer; and undercutting an interior of the substrate to be hollow, so as to form the sheet-like slab layer.

The other objects, features, and advantages of the present invention are specifically set forth in or will become apparent from the following detailed description of the invention when read in conjunction with the accompanying drawings.

DETAILED DESCRIPTION

Exemplary embodiments of a semiconductor device and a method of manufacturing the semiconductor device according to the present invention will be explained hereinafter in detail with reference to the accompanying drawings.

Figure 1A:
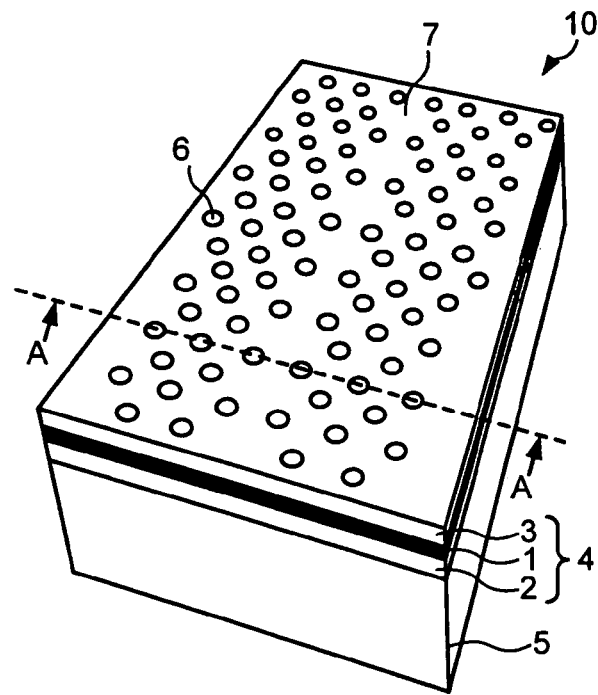
FIG. 1A is a perspective view of a semiconductor device according to a first embodiment of the present invention.
Figure 1B:
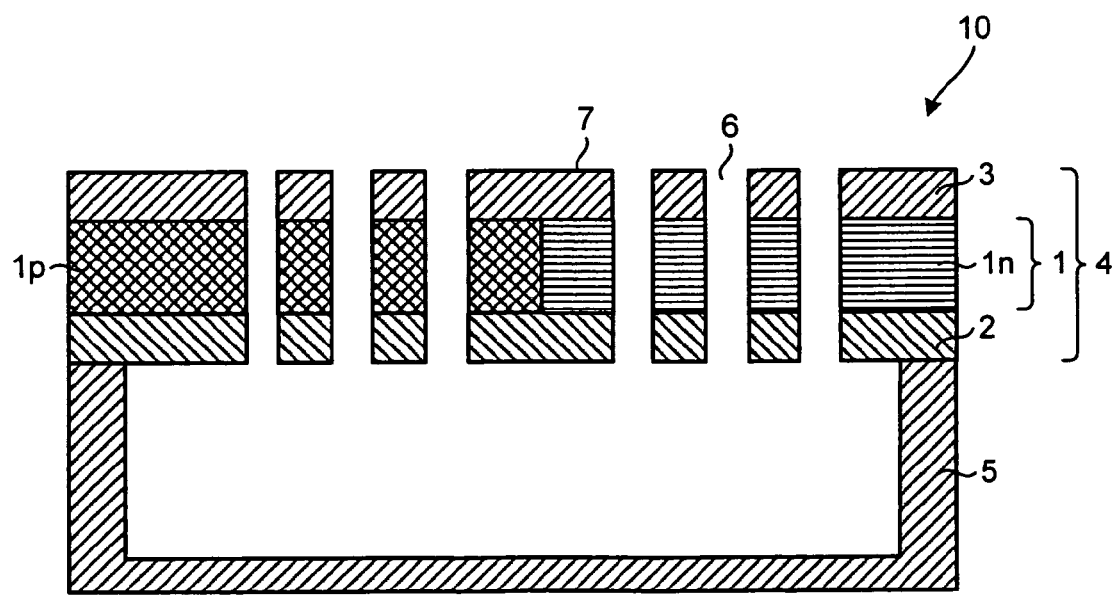
FIG. 1B to FIG. 1D are cross-sectional views, taken along a line A-A shown in FIG. 1A, of the semiconductor device according to the first embodiment.

FIG. 1A and FIG. 1B typically illustrate a semiconductor device 10 according to a first embodiment of the present invention. FIG. 1A is a perspective view, and FIG. 1B is a cross-sectional view, taken along a line A-A shown in FIG. 1A, of the semiconductor device 10.

Figure 1C:
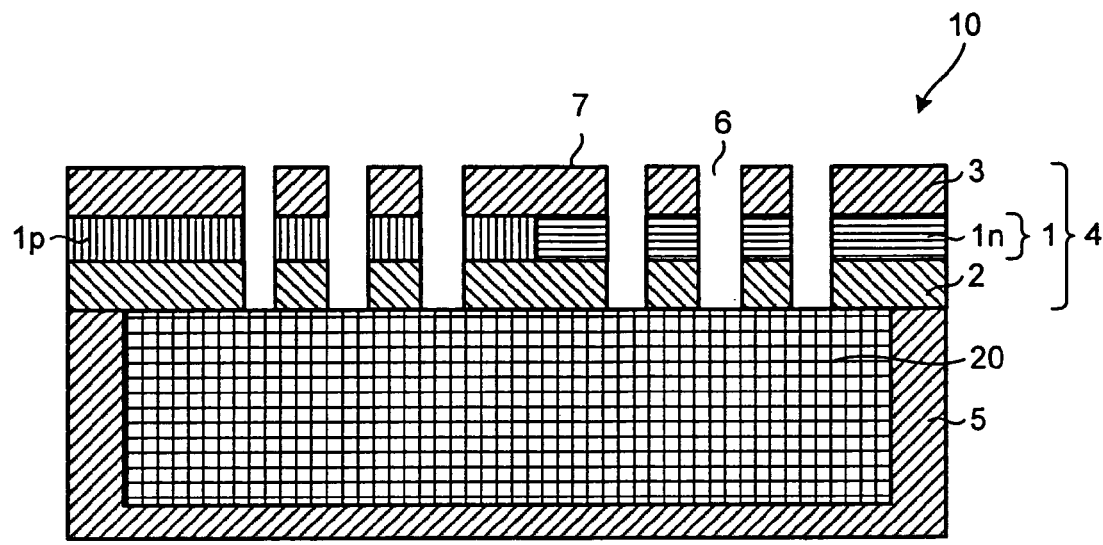
Figure 1D:
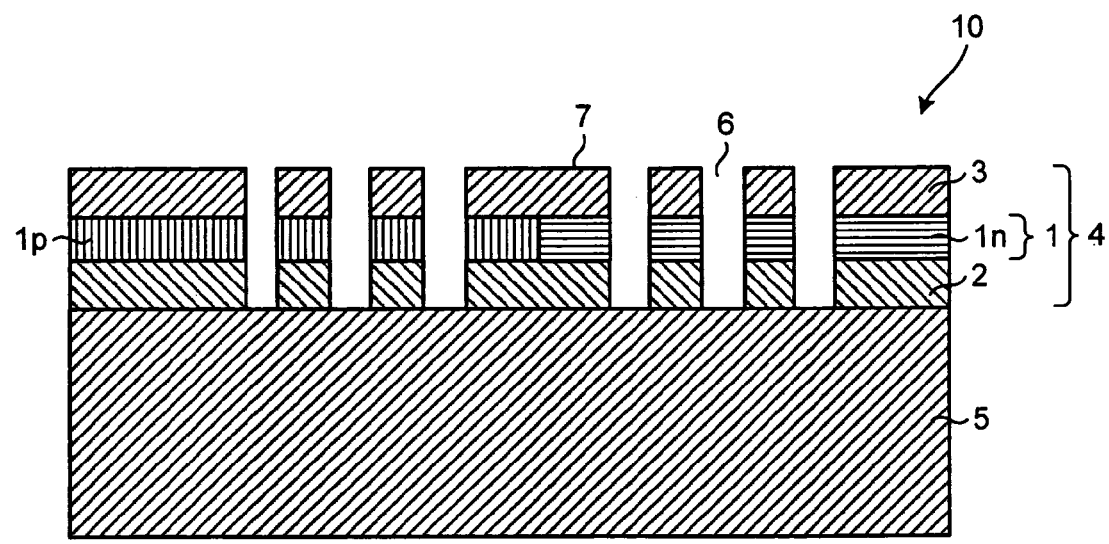

The semiconductor device 10 is constituted based on a two-dimensional slab photonic crystal structure. In the semiconductor device 10, a slab layer 4 is formed by sequentially stacking a lower cladding layer 2, an active layer 1, and an upper cladding layer 3 on a substrate 5, an interior of which is hollow, and a periodic refractive index profile structure is formed in a two-dimensional plane of the slab layer 4. In the example of FIG. 1A and FIG. 1B, a triangular lattice-like air hole structure 6 is formed, as the periodic refractive index profile structure formed on the slab layer 4, to penetrate the slab layer 4 in a stack direction. A linear defect (waveguide 7) for the periodic air hole structure 6 in the two-dimensional plane is formed near a center of the slab layer 4. In another embodiment, as shown in FIG. 1C, the semiconductor device 10 is constituted based on the two-dimensional slab photonic crystal structure. In the semiconductor device 10, a dielectric layer 20 is formed in a lower portion of the periodic air hole structure 6, the slab layer 4 is formed by sequentially stacking the lower cladding layer 2, the active layer 1, and the upper cladding layer 3 on the dielectric layer 20, and the periodic refractive index profile structure is formed in the two-dimensional plane of the slab layer 4. In still another embodiment, as shown in FIG. 1D, the semiconductor device 10 is constituted based on the two-dimensional slab photonic crystal structure. In the semiconductor device 10, a solid semiconductor layer 5 is formed in the lower portion of the periodic air hole structure 6, the slab layer 4 is formed by sequentially stacking the lower cladding layer 2, the active layer 1, and the upper cladding layer 3 on the solid semiconductor layer 5, and the periodic refractive index profile structure is formed in the two-dimensional plane of the slab layer 4.

Figure 2A:
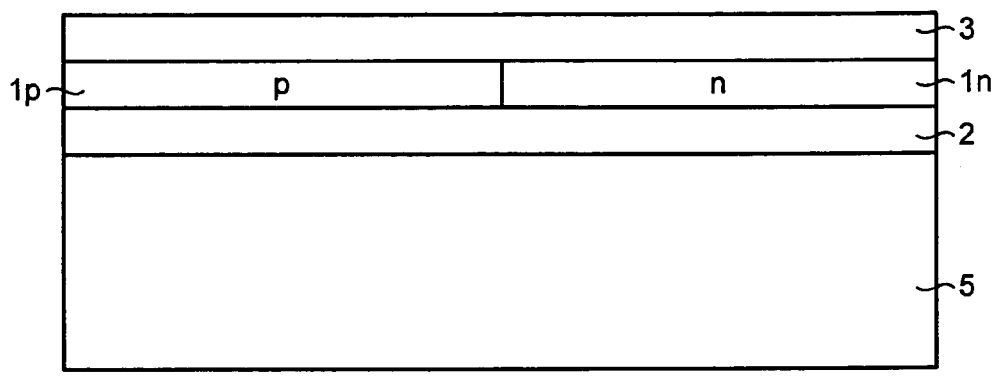
FIG. 2A to FIG. 2C typically illustrate forms of a pn junction in a slab layer.
Figure 2B:
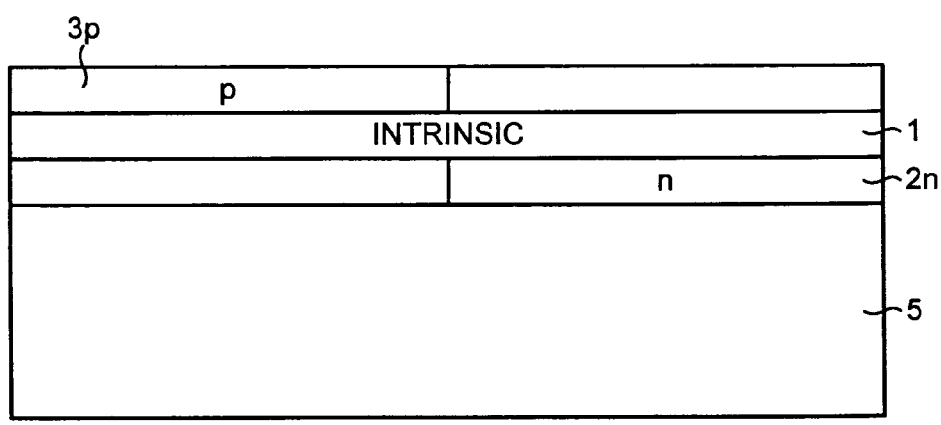
Figure 2C:
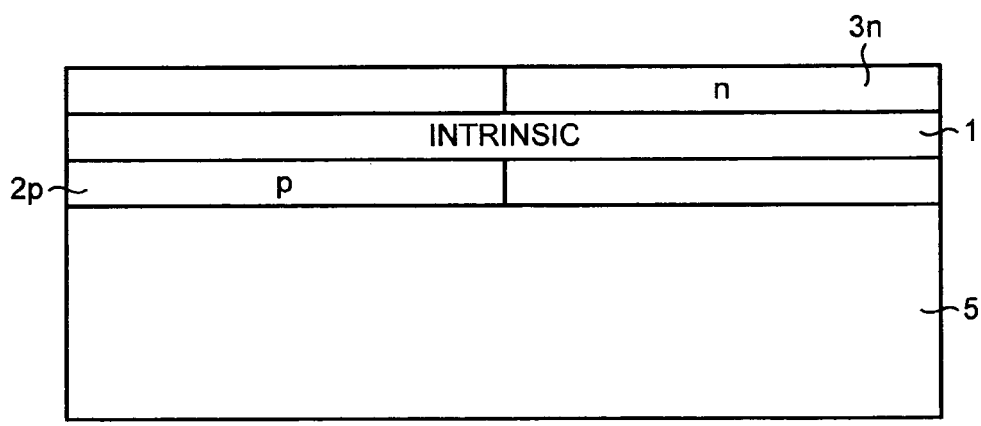

The present invention is characterized as follows. In the semiconductor device 10 including the two-dimensional slab photonic crystal thus constituted, a p-type region and an n-type region are formed in surfaces of the stacked layers in the slab layer 4 and a pn junction surface having a predetermined angle with respect to the surfaces of the stacked layers in the slab layer 4 is formed in order to pump the active layer 1 by current injection. FIG. 2A to FIG. 2C typically illustrate form of a pn junction in the slab layer 4. To facilitate understanding of these forms, the air hole structure 6 is not shown in FIG. 2A to FIG. 2C. A pn junction may be formed by forming a p-type region 1p and an n-type region 1n in the active layer 1 as shown in FIG. 2A. The pn junction may be formed by forming an n-type region 2n and a p-type region 3p in the lower and upper cladding layers 2 and 3, between which the active layer 1 as an intrinsic layer is put, respectively, as shown in FIG. 2B or forming a p-type region 2p and an n-type region 3n in the upper and lower cladding layers 2 and 3, respectively, as shown in FIG. 2C. Further, the pn junction may be formed by a combination thereof. Namely, each of the p-type region and the n-type region may be formed in the active layer, the lower cladding layer 2, or the upper cladding layer 3 so as to form a pn junction surface in the slab layer 4 at a predetermined angle with respect to the surfaces of the stacked layers in the slab layer 4.

By thus forming the pn junction surface so as to have the predetermined angle with respect to the surfaces of the stacked layers in the slab layer 4, a current can be carried to cross the pn junction surface. It is preferable that a cross line between the pn junction surface and the surfaces of the stacked layers in the slab layer 4 is equal to an extension direction of the waveguide (linear defect) 7. In order to carry the current to cross the pn junction surface, it is not always necessary to attach electrodes vertically to the stack direction of the slab layer 4 but it suffices to arrange them on both sides of the slab layer 4 between which the pn junction is put, respectively. As a result, it is possible to simplify the structure and manufacturing of the semiconductor device 10 having the two-dimensional slab photonic crystal structure in which the electrodes are attached.

The semiconductor device 10 is made of compound semiconductors each having a heterojunction if the active layer 1 is a single layer. The semiconductor device 10 is made of compound semiconductors each having a multiple quantum well (MQW) junction if the active layer has an MQW structure. Accordingly, any ordinary compound semiconductor can be used as a material for each of the active layer 1 and the cladding layers 2 and 3. Specifically, GaAs, InGaAsP, AlGaAs, GaP, GaAsP, AlGaInP, GaInNAs or the like can be as a material for each of the active layer 11 and the cladding layers 2 and 3. Zn, Be, Cd, Si, Ge, C, Mg or the like can be used as a p-type dopant to transform the material to the p-type material, and Si, Ge, S, Sn, or Te can be used as an n-type dopant to transform the material to the n-type material.

A method of manufacturing the semiconductor device 10 will next be explained. FIG. 3A to FIG. 3G are cross-sectional side views to explain the method of manufacturing the semiconductor device 10. In FIG. 3A to FIG. 3G, an instance in which InP is used as a material for the substrate 5, n-type InGaAsP (n-InGaAsP) is used as a material for each of the lower cladding layer 2, the active layer 1, and the upper cladding layer 3, and in which Zn is used as a p-type dopant will be explained.

Figure 3A:
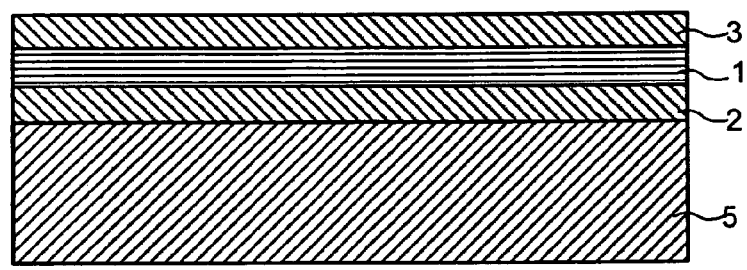
FIG. 3A to FIG. 3G are cross-sectional side views which typically illustrate a method of manufacturing the semiconductor device.

On an InP substrate 5, a thin film of an n-InGaAsP layer that serves as the lower cladding layer 2 having a relatively large energy band gap is grown by a crystal structure system such as a metal-organic chemical vapor deposition (MOCVD) system or a molecular beam epitaxy (MBE) system. A thin film of the active layer 1 having a relatively small energy band gap as compared with that of the lower cladding layer 2, i.e., made of n-InGaAsP slightly different in composition ratio from the lower cladding layer 2, and including an MQW layer and a barrier layer, is then grown by the crystal growth system such as the MOCVD or MBE system. Thicknesses, the number of layers, and energy band gap values of the MQW layer and the barrier layer determine a light emission wavelength band of the active layer 1. Therefore, the active layer 1 is formed in accordance with the wavelength band of the two-dimensional slab photonic crystal structure and the wavelength band required for the semiconductor device 10 to be manufactured. On the active layer 1, a thin film of an n-InGaAsP layer that serves as the upper cladding layer 3 having a relatively large energy band gap is grown by the crystal growth system such as the MOCVD or MBE system. A state in which the lower cladding layer 2, the active layer 1, and the upper cladding layer 3 are thus formed on the substrate 5 is shown in FIG. 3A.

Figure 3B:
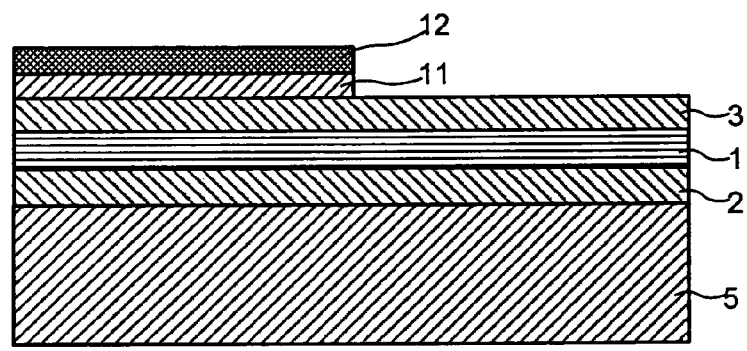
Figure 3C:
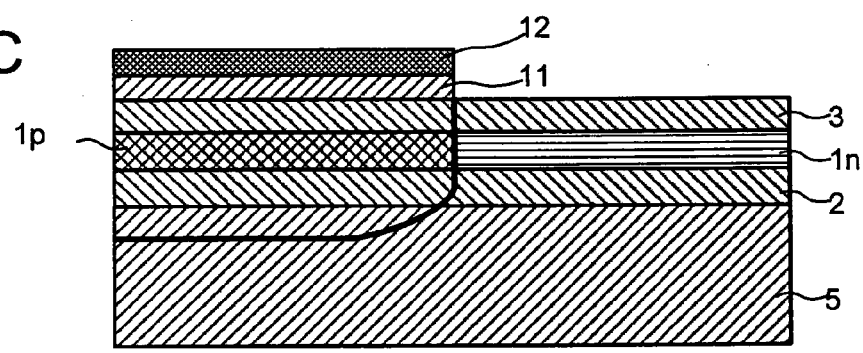

As shown in FIG. 3B, a ZnO layer 11 is stacked on substantially half of the upper cladding layer 3, and a mask layer 12 made of $Si_3N_4$ or $SiO_2$ is formed on the ZnO layer 11. Thereafter, the substrate on which the ZnO layer 11 and the mask layer 12 are formed is subjected to annealing in a high temperature bath, thereby diffusing Zn to reach the active layer 1. As a result, Zn is diffused into the active layer 1 and the pn junction is formed in the active layer 1. FIG. 3C illustrates this state. That is, the active layer includes two regions of the n-type region 1n and the p-type region 1p. The mask layer 12 acts as a cap that prevents the dopant from being diffused from the surface of the film into an annealing atmosphere during the annealing.

Figure 3D:
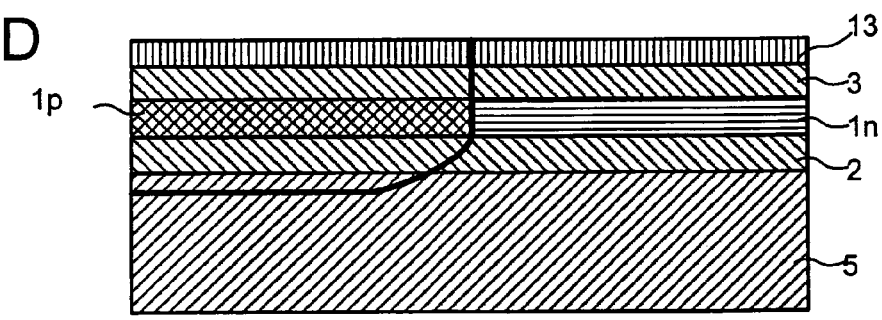

The mask layer 12 and the ZnO layer 11 are removed and an electron beam (EB) exposure resist 13 made of an organic material is applied onto an upper surface of the upper cladding layer 3. FIG. 3D illustrates this state.

Figure 3E:
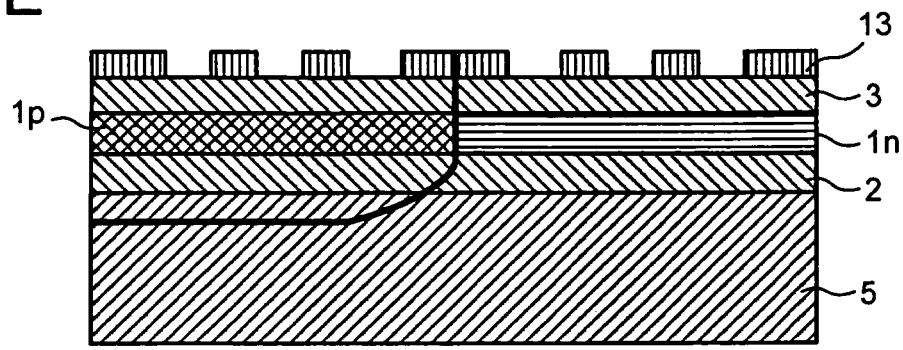

As shown in FIG. 3E, a pattern for forming a refractive index profile structure including a defect structure (which is the periodic air hole structure 6 in the two-dimensional plane in this embodiment) is drawn by an EB exposure system. The EB exposure resist 13 in the region in which the refractive index profile structure is to be formed is removed while the EB exposure resist 13 in the region other than the region is left.

Figure 3F:
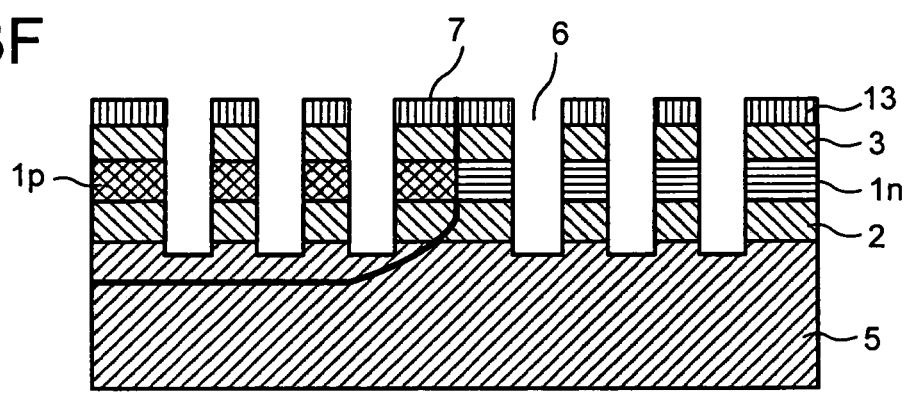

As shown in FIG. 3F, etching is performed up to an upper portion of the substrate 5 to penetrate the slab layer 4 from the upper cladding layer 3 to the InGaAsP layer that is the lower cladding layer 2, by an etching device such as a reactive ion etching (RIE) device or an induced coupled plasma etching (ICP) device, thereby forming the air hole structure 6. At this moment, if the substrate 5 is etched to some extent, a next step of selectively removing a substrate part in a lower portion of the periodic structure can be easily, appropriately executed. Thereafter, the EB exposure resist 13 applied onto the region in which etching has not been performed is removed.

Figure 3G:
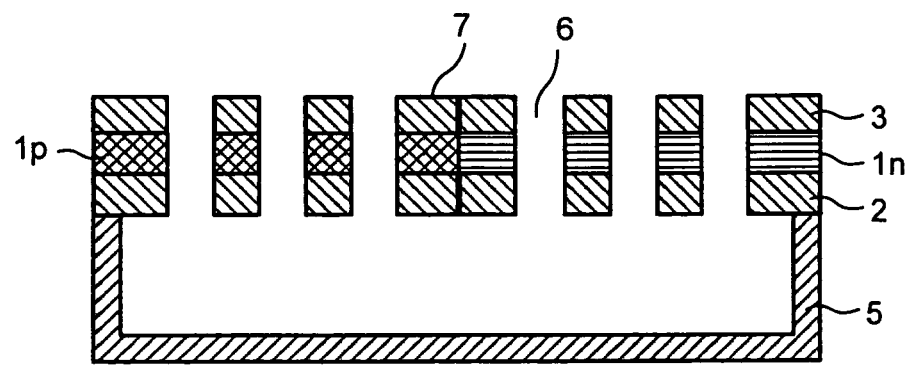

As shown in FIG. 3G, only the substrate 5 in the lower portion of the two-dimensional periodic air hole structure 6 is selectively removed by wet etching, thereby obtaining the semiconductor device 10 having the two-dimensional slab photonic crystal structure including the pn junction surface having a predetermined angle with respect to the surfaces of the stacked layers in the slab layer 4. At this moment, the interior of the substrate 5 is hollow and the peripheral edge portion of the sheet-like slab layer 4 is supported by the substrate 5. With this structure, upper and lower surfaces of the slab layer 4 are in contact with the air. In the example of FIG. 3A to FIG. 3G, a pn junction surface at an angle substantially perpendicular to the surfaces of the stacked layer in the slab layer 4 is formed.

While FIG. 3A to FIG. 3G illustrate an example of the method of manufacturing the semiconductor device 10, the semiconductor device 10 may be manufactured by some other method. For example, after the mask layer 11 and the ZnO layer 12 shown in FIG. 3C are removed, a dielectric mask or a metallic mask layer including a dielectric film made of $SiN_x$, $SiO_2$ or the like and a metallic film made of Ti or the like is deposited on the upper cladding layer 3. A pattern for forming the periodic refractive index structure (which is the periodic air hole structure 6) including the defect structure is formed on the dielectric mask or metallic mask layer by a photo-etching process, an EB etching process, or the like. Etching is performed up to the upper layer portion of the substrate 5 so as to penetrate the slab layer 4 from the upper cladding layer 3 to the lower cladding layer 2. In addition, only the substrate 5 that constitutes the lower portion of the air hole structure 6 is selectively removed by wet etching for selectively removing the interior of the substrate 5. Finally, the dielectric film and the metallic film in portions in which etching has not been performed are removed, thereby obtaining the semiconductor device 10.

If the pn junction is formed on the active layer 1 in FIG. 3A to FIG. 3G, the upper and lower cladding layers 2 and 3 are kept undoped (intrinsic) particularly before diffusing Zn as the p-type dopant into the active layer 1. By doing so, the pn junction obtained by Zn diffusion is formed only in the active layer 1 and a current can be efficiently applied to the pn junction in the active layer 1. The instance in which the pn junction surface is formed on the active layer 1 has been explained with reference to FIG. 3A to FIG. 3G. Alternatively, the active layer 1 may be an intrinsic layer and the pn junction may be formed on the upper and lower cladding layers 2 and 3 between which the active layer 1 is put. If so, it is preferable to form a p-type structure and an n-type structure or the n-type structure and the p-type structure diagonal to each other on the upper and lower cladding layers 2 and 3, respectively, with the (portion which serves the) waveguide 7 put therebetween. Namely, the lower cladding layer 2 is doped with the n-type (or the p-type) dopant by injecting ions only into one side of the layer 2 relative to a neighborhood of a center of the (portion which serves the) waveguide 7. The upper cladding layer 3 is doped with the p-type (or the n-type) dopant by injecting or diffusing ions into the opposite side (that is, a portion diagonal to the n-type or p-type structure on the lower cladding layer 2) of the layer 3. By doing so, a state similar to a boundary between the p-type structure and the n-type structure is realized on the active layer in the portion constituting the waveguide 7 and the current is efficiently carried locally. At this moment, it is necessary to perform annealing so that the dopant sufficiently reaches the upper cladding layer 2.

Figure 4A:
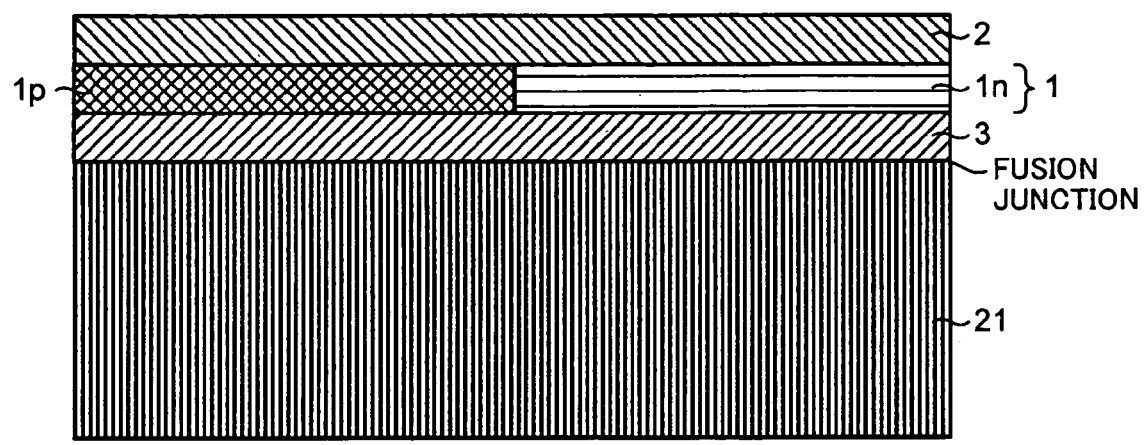
FIG. 4A and FIG. 4B are cross-sectional views which typically illustrate an example of the configuration of the semiconductor device.
Figure 4B:
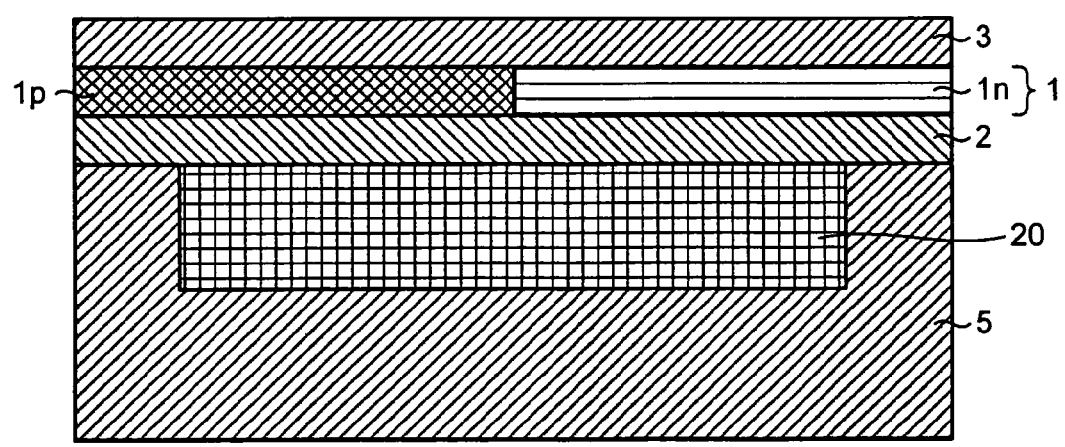

Furthermore, by determining whether surface morphology is good or whether accuracy for managing dopant diffusion time is high, the entire substrate may be a p-type wafer, i.e., the active layer 1 or the upper and lower cladding layers 2 and 3 may be doped with the p-type dopant and the n-type dopant may be diffused only to a desired position using the crystal growth system, depending on process conditions and a combination of dopant materials. Further, as shown in FIG. 4A, after manufacturing the semiconductor device 10 shown in FIG. 3G, a separately prepared substrate 21 may be fusion-connected to the upper cladding layer 3 in the slab layer 4 and the original substrate 5 may be cut off. As shown in FIG. 4B, the semiconductor device 10 shown in FIG. 1C can be manufactured by selecting an Al-containing compound semiconductor material as a material for the substrate 5, and oxidizing the Al-containing compound semiconductor material to form a dielectric layer 20 made of $Al_2O_3$ or the like after the step shown in FIG. 3F by a method including steps of arranging the Al-containing compound semiconductor material in, for example, a steam atmosphere, and of setting the temperature of the compound semiconductor material at a high temperature of 300 degrees or more, or the like. If the semiconductor device 10 is thus manufactured, the step shown in FIG. 3G after the step shown in FIG. 3F is not executed. In FIG. 1C, the Al-containing compound semiconductor material is used as a material for the substrate 5. Alternatively, an Al-containing compound semiconductor material may be formed between the substrate 5 which does not contain Al and the lower cladding layer 2 or between the substrate 5 and the lower cladding layer 2 and on the upper cladding layer 3 (the resultant substrate corresponds to, for example, an epitaxially grown substrate referred to as "epitaxial wafer" or "epitaxial substrate" obtained by epitaxially growing a buffer layer, upper and lower cladding layers, an MQW active layer or the other active layer, and an Al-containing compound semiconductor film such as an AlGaAs layer on a crystal substrate which does not contain Al such as an InP crystal substrate). The Al-containing compound semiconductor material may be oxidized after the step shown in FIG. 3F.

According to the first embodiment, the semiconductor device 10 is constituted by the two-dimensional slab photonic crystal including the pn junction surface at the predetermined angle with respect to the surfaces of the stacked layers in the slab layer 4. Therefore, it is advantageously possible to carry the current for pumping the active layer 1 in the direction parallel to the surfaces of the stacked layers in the slab layer 4. In this first embodiment, the other layers are not explained in detail so as to explain the pn junction in detail. However, it is necessary to form an ohmic contact layer at need to obtain an ohmic junction when forming electrodes, which will be explained later. Further, after forming the periodic air hole structure 6 as shown in FIG. 3F, a thin semiconductor slab layer that efficiently confines light can be formed by transforming an Al-containing semiconductor made of AlAs, AlGaAs, or AlInAs to a low refractive index dielectric, instead of removing the lower portion of the substrate 5 by selective etching. Instead of using the slab structure, it is possible to obtain a high refractive index difference that cannot be obtained by ordinary crystal growth of semiconductors of the same type, by the junction of semiconductors of different types such as GaAs and InP using by fusion junction. This structure enables efficient optical confinement as compared with the instance of stacking the active layer 1 and the upper and lower cladding layers 2 and 3 on the semiconductor of the same type and improving the radiation characteristics and mechanical strength of the semiconductor device 10.

Figure 5A:
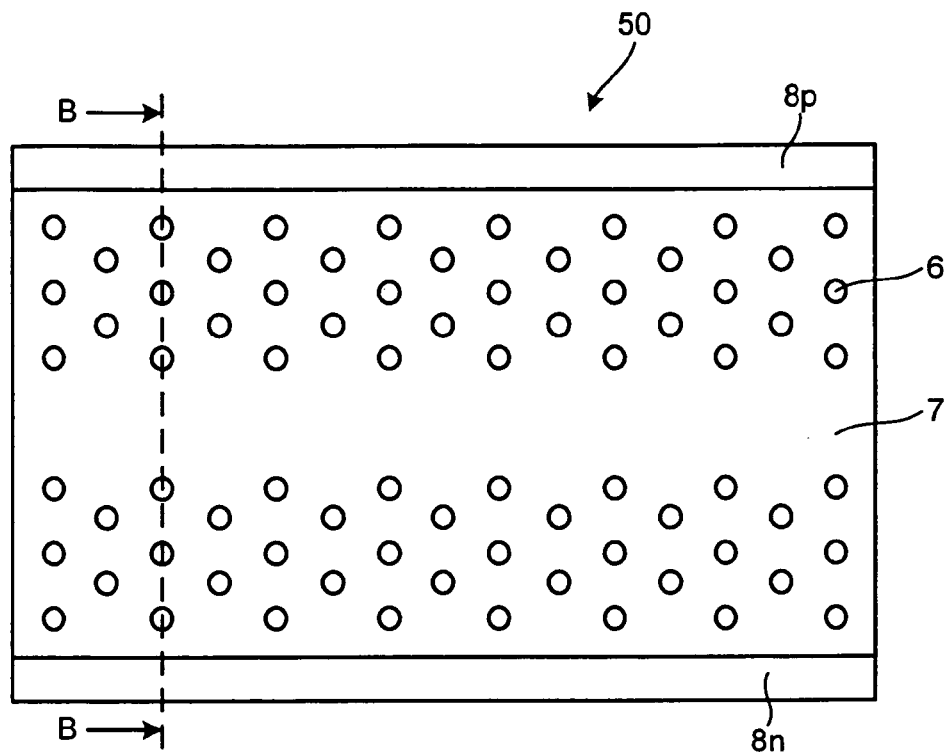
FIG. 5A is a plan view of a semiconductor device according to a second embodiment of the present invention.
Figure 5B:
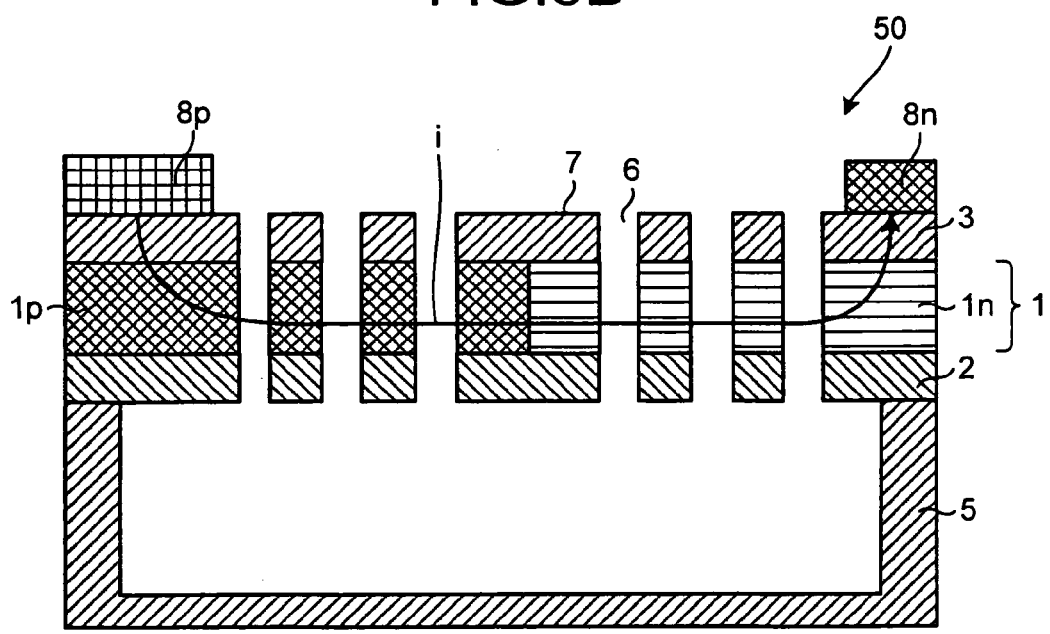
FIG. 5B is a cross-sectional view, taken along a line B-B shown in FIG. 5A, of the semiconductor device according to the second embodiment

FIG. 5A and FIG. 5B are views to explain a semiconductor device 50 according to a second embodiment of the present invention. The semiconductor device 50 includes electrodes, to inject an electric current into the device, in addition to the configuration of the semiconductor device 10 according to the first embodiment. FIG. 5A is a plan view of the semiconductor device 50 and FIG. 5B is a cross-sectional view, taken along a line B-B shown in FIG. 5A.

Electrodes $8p$ and $8n$ for injecting a current into the semiconductor device 50 are formed on respective both end portions of the semiconductor device 50 that includes the pn junction surface at the predetermined angle with respect to the surfaces of the stacked layers in the slab layer 4 explained in the first embodiment, between which the waveguide 7 is put, so as to be substantially in parallel to the extension direction of the waveguide 7. It is preferable that a direction of the cross line between the pn junction surface and the surfaces of the stacked layers in the slab layer 4 is substantially equal to the extension direction of the waveguide 7. By connecting a positive electrode of a power supply to the electrode $8p$ formed in the p-type region $1p$ of the active layer 1 and connecting a negative electrode of the power supply to the electrode $8n$ formed in the n-type region $1n$ of the active layer 1, an injection current i can be injected into the semiconductor device 50 substantially horizontally to the active layer 1. As a result, carriers can be efficiently injected into the pn junction section. Such a configuration enables efficient lasing if the semiconductor device 50 is employed as the semiconductor laser oscillator.

The electrodes $8p$ and $8n$ are formed by covering a mask on portions of the semiconductor device 50, manufactured in FIG. 3F which illustrates the first embodiment, in which portions the electrodes $8p$ and $8n$ are not formed, and by depositing an electrode material on the semiconductor device 50. During the formation of the electrodes $8p$ and $8n$, an alloy containing a combination of Au, An, Ti, Ni, Mg, In, Cr, Cu, Mo, W, Si, AI, Ag, Pt, and the like can be used as a material for the p-type electrode $8p$ formed in the p-type region, and an alloy containing a combination of Au, Ge, Ni, In, W, Ag, Sn, Te, Mo, W, Si, AI, Cu, Pd, Ta, Bi, Be, and the like can be used as a material for the n-type electrode $8n$ formed in the n-type region.

Further, by using, as the substrate 5, a semi-insulating substrate made of Fe-doped InP, undoped (intrinsic) GaAs, or Cr-doped GaAs, it is possible to suppress leakage of the injection current i to the substrate 5 and to realize more efficient carrier injection into the active layer 1. If the entire substrate 5 is not semi-insulating, but if the p-type or n-type semiconductor substrate 5 is used and the lower cladding layer 2 is a semi-insulating layer or an undoped layer or if a semi-insulating layer or an undoped layer having a thickness of 100 nanometers or more is formed between the lower cladding layer 2 and the substrate 5, then it is also possible to suppress the leakage of the injection current i to the substrate 5.

Furthermore, as shown in FIG. 5B, if the upper cladding layer 3 is a cladding layer doped with the p-type dopant and the lower cladding layer 2 is a cladding layer doped with the n-type dopant, the current can be efficiently carried to the pn junction section in the active layer 1. If so, by using at least one of boundaries between the active layer 1 and the upper cladding layer 3 and between the active layer 1 and the lower cladding layer 2 as a waveguide part, it is possible to easily concentrate the current on the waveguide part of active layer 1 and to realize efficient lasing. By using both of the boundaries between the active layer 1 and the upper cladding layer 3 and between the active layer 1 and the lower cladding layers 2 as the waveguide part and arranging the upper and lower cladding layers 2 and 3 so that cross sections thereof are diagonal to each other as shown in the cross section of FIG. 2B and FIG. 2C, it is possible to more easily concentrate the injection current on the waveguide part of the active layer 1 and to realize more efficient lasing. In the second embodiment, even if the upper cladding layer 3 is doped with the n-type dopant and the lower cladding layer 2 is doped with the p-type dopant, the semiconductor device 50 can exhibit the same advantages.

According to the second embodiment, the electrodes $8p$ and $8n$ are formed on the respective both end portions of the two-dimensional slab photonic crystal, between which the waveguide 7 is put in the direction substantially equal to the extension direction of the pn junction surface provided at the predetermined angle with respect to the surfaces of the stacked layers in the slab layer 4, so as to be substantially in parallel to the extension direction of the waveguide 7. Therefore, carriers can be efficiently injected into the pn junction section of the active layer 1.

Figure 6A:
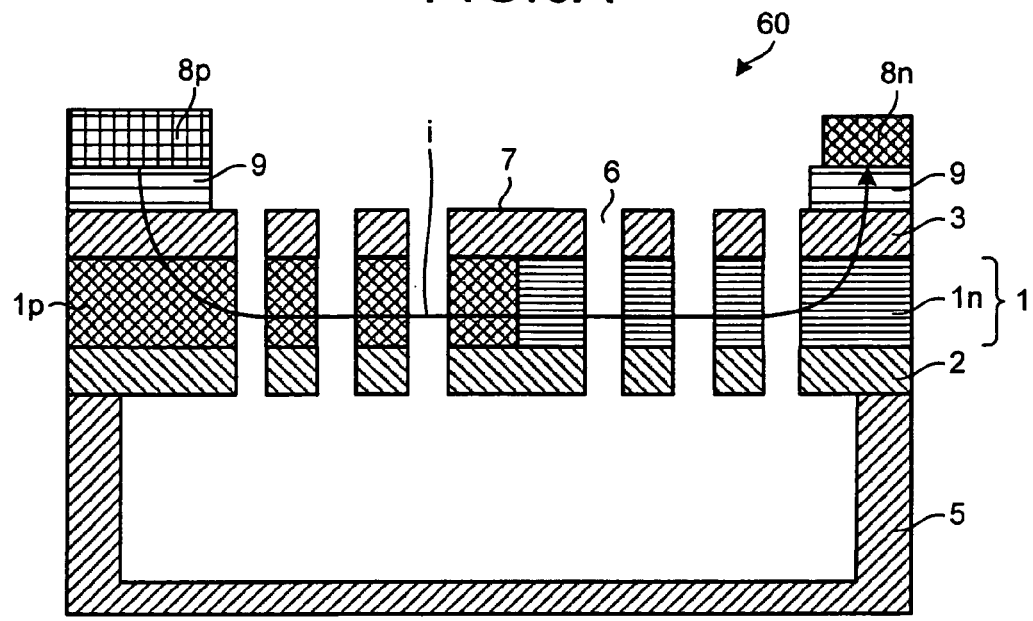
FIG. 6A to FIG. 6C are cross-sectional views of a semiconductor device according to a third embodiment of the present invention.
Figure 6B:
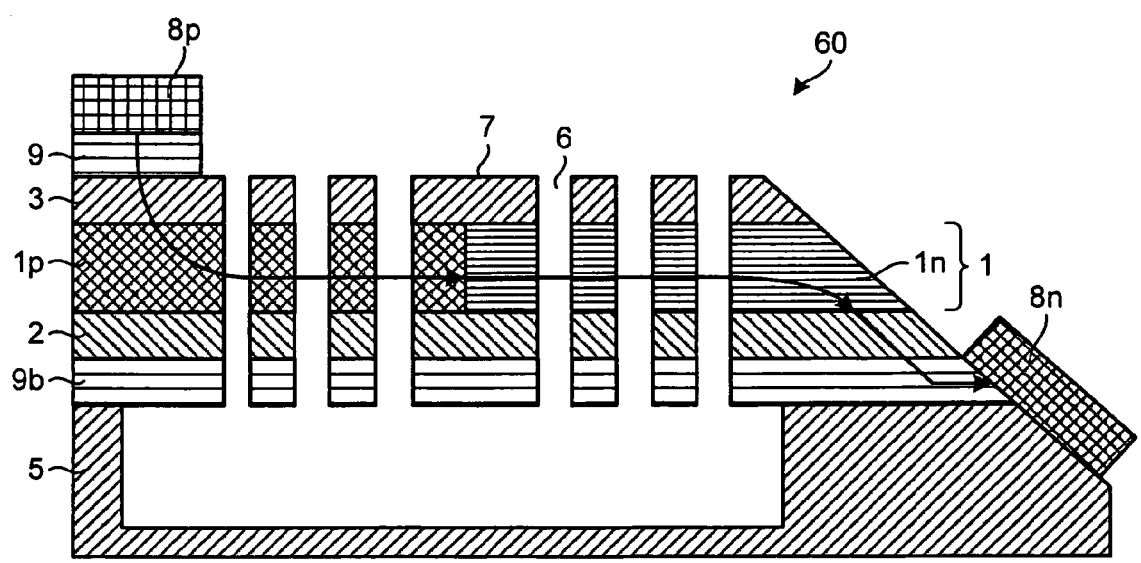
Figure 6C:
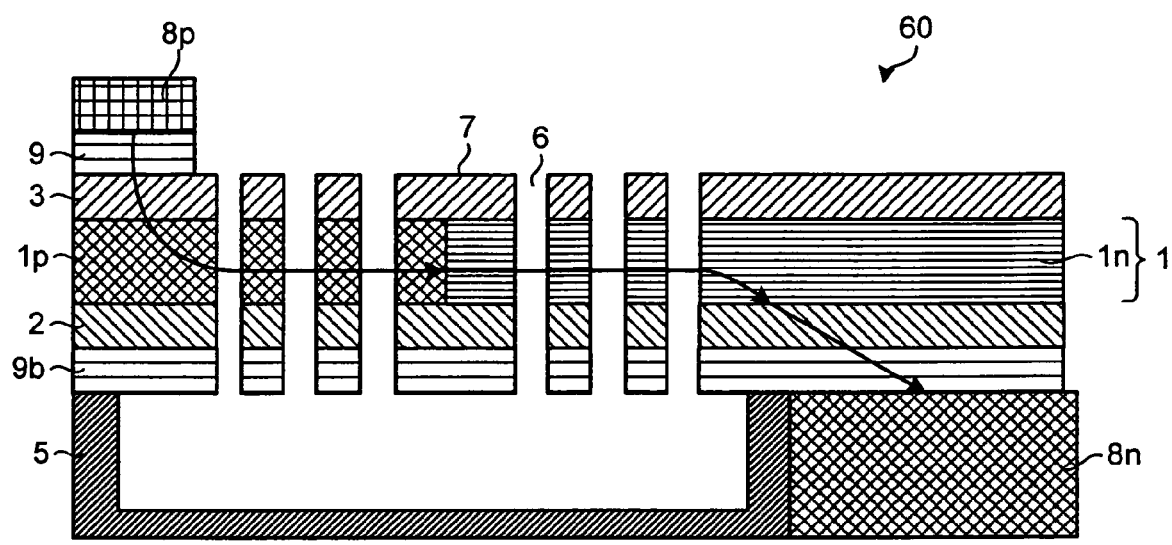

FIG. 6A to FIG. 6C are cross-sectional views of a semiconductor device 60 according to a third embodiment of the present invention. The semiconductor device 60 is characterized in that the ohmic contact layer 9 made of InGaAs or the like is formed, as an uppermost layer, between the two-dimensional slab photonic crystal (upper cladding layer 3) and electrodes 8 so as to have ohmic contact between the electrodes 8 and the slab layer 4. However, if the ohmic contact layer 9 is left on an upper portion of a laser light emission section, the ohmic contact layer 9 functions as an optical absorption layer. Therefore, it is necessary to remove the ohmic contact layer 9 from the periodic two-dimensional refractive index profile structure. As shown in FIG. 6B and 6C, another ohmic contact layer 9b may be formed under the lower cladding layer 2. As shown in FIG. 6B, a cross section of the n-type electrode 8n-side semiconductor device 60 ranging from the substrate 5 to the upper cladding layer 3 may be exposed by anisotropic etching, and the n-type electrode 8n may be formed on the ohmic contact layer 9b in the exposed lower portion of the semiconductor device 60 as will be explained later. As shown in FIG. 6C, the n-type electrode 8n-side substrate 5 may be removed to expose the ohmic contact layer 9b in the lower portion of the semiconductor device 60 and the n-type electrode 8n may be formed in the removed portion.

Figure 7A:
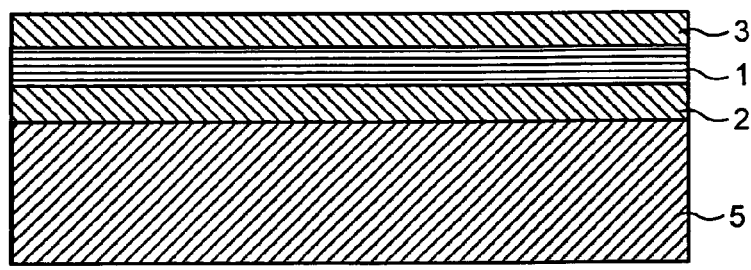
FIG. 7A to FIG. 7J are cross-sectional views for explaining an example of a method of manufacturing the semiconductor device in the third embodiment.
Figure 7B:
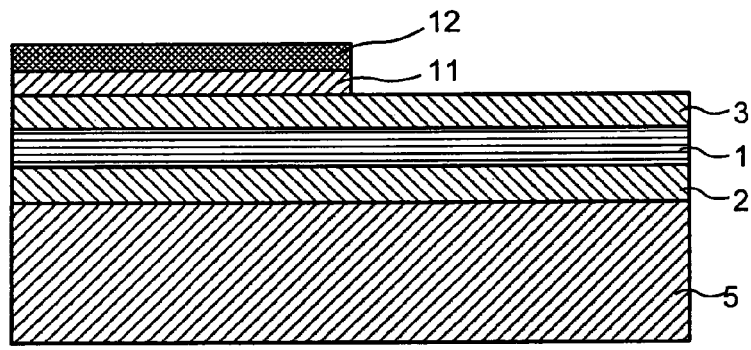
Figure 7C:
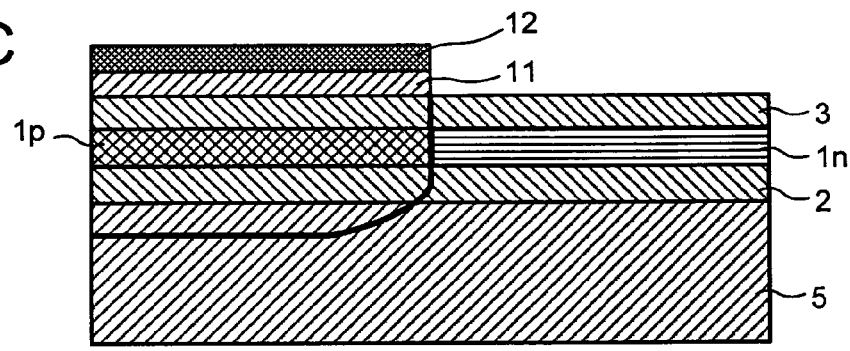

FIG. 7A to FIG. 7J are cross-sectional views for explaining an example of a method of manufacturing the semiconductor device 60. Similarly to the steps shown in FIG. 3A to FIG. 3C which illustrate the first embodiment, the lower cladding layer 2 such as an n-InGaAsP layer, the active layer 1 made of n-InGaAsP or the like and including the MQW layer and the barrier layer, and the upper cladding layer 3 such as an n-InGaAsP layer are formed by the crystal growth system such as a metal-organic chemical vapor deposition (MOCVD) or a molecular beam epitaxy (MBE) system, and sequentially stacked on the InP substrate 5. Using a dielectric mask or the like, the ZnO layer 11 is stacked on substantially the half surface of the upper cladding layer 3. The resultant substrate 5 is subjected to annealing in the high temperature bath to diffuse Zn into the active layer 1 or the lower cladding layer 2, and the pn junction is formed on the active layer 1 or the upper and lower cladding layers 2 and 3 (FIG. 7A to FIG. 7C). At this moment, an alignment mark that can identify the pn junction section is added to a portion of the upper cladding layer 3 in which the electrode 8 or the like is not formed.

Figure 7D:
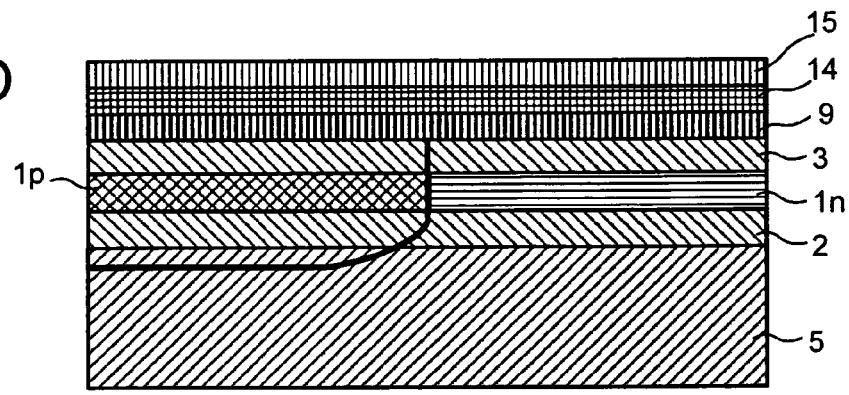
Figure 7E:
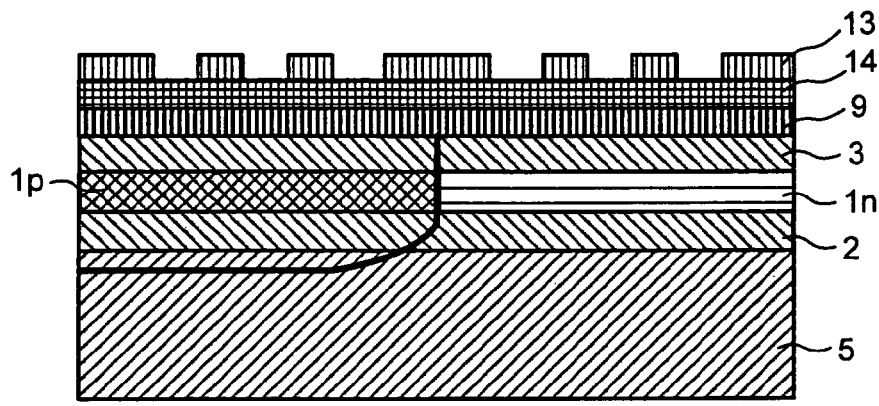
Figure 7F:
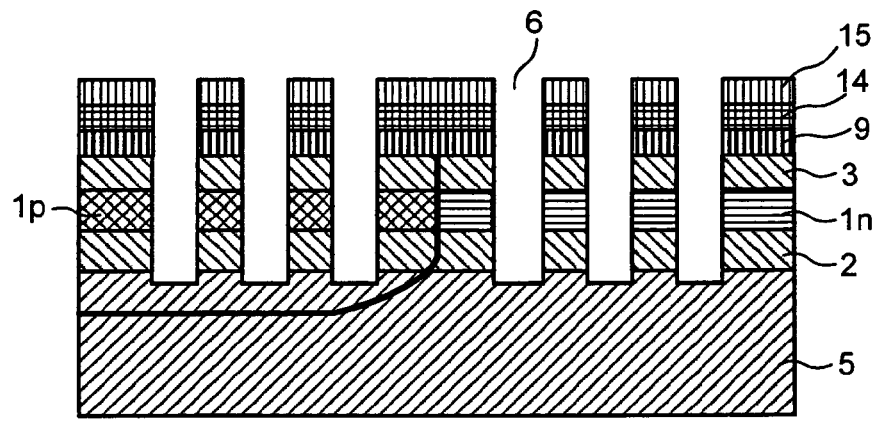

After removing the ZnO layer 11 and the mask layer 12 used to diffuse the dopant, the ohmic contact layer 9 is stacked on an upper surface of the upper cladding layer 3 as shown in FIG. 7D, and a dielectric mask layer 14 made of $SiN_x$, $SiO_2$ or the like and an EB exposure resist layer 15 are formed on the ohmic contact layer 9. Thereafter, as shown in FIG. 7E, based on the alignment mark added onto the surface of the substrate 5, a pattern for forming the periodic refractive index profile structure including a defect structure is drawn by the EB exposure device. In addition, the EB exposure resist layer 15 in a portion in which the periodic refractive index profile structure is to be formed is removed while leaving the layer 15 in portions other than the portion in which the periodic refractive index profile structure is formed. At this step, the pattern for forming the periodic refractive index profile structure including the defect structure is drawn by the EB exposure device so that a center of a width of the linear defect that serves as the waveguide 7 is at a position of the alignment mark. As shown in FIG. 7F, the air hole structure 6 is formed to penetrate the surfaces of the stacked layers in the slab layer 4 substantially in a perpendicularly direction by the etching system such as the ICP system.

Figure 7G:
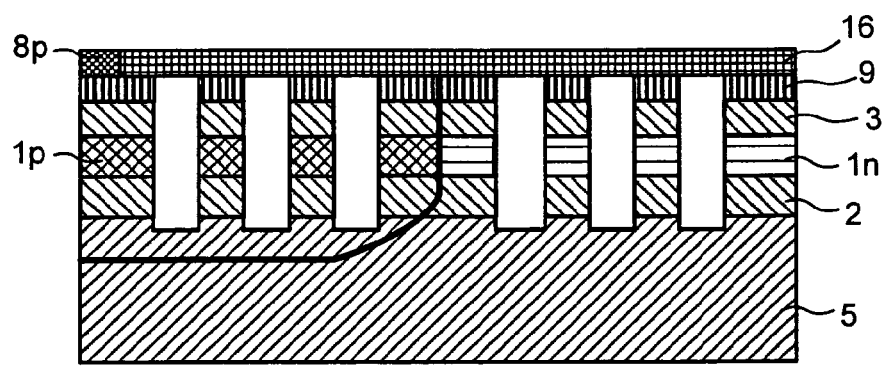

After removing the EB exposure resist layer 15 and the dielectric mask layer 14, a first photomask 16 is formed on the ohmic contact layer 9. The first photomask 16 at a position at which the p-type electrode 8p formed in the p-type region is arranged is removed. The p-type electrode 8p, including, for example, AuZn of a thickness of 50 nanometers, Ti of a thickness of 10 nanometers, and Al of a thickness of 500 nanometers, is formed in the first photomask 16-removed portion by vacuum evaporation, sputtering, or the like, and the electrode 8p is alloyed. FIG. 7G illustrates this state.

Figure 7H:
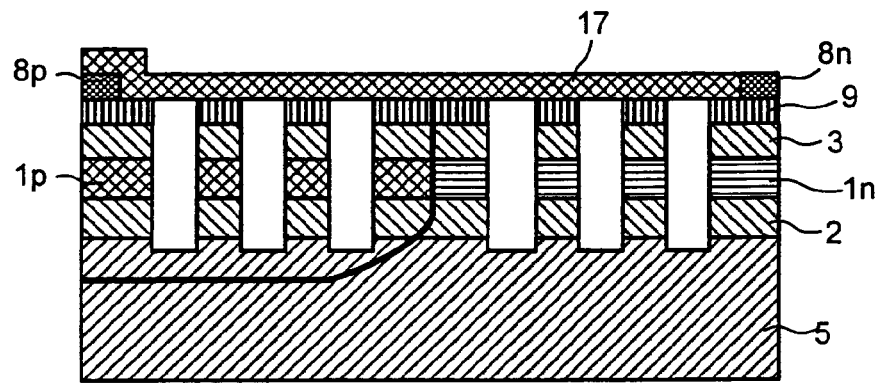

After removing the first photomask 16, a second photomask 17 is formed on the ohmic contact layer 9 and the p-type electrode 8p, and the second photomask 17 at a position at which the n-type electrode 8n formed in the n-type region is arranged is removed. The n-type electrode 8n, including, for example, AuGe of a thickness of 50 nanometers, Ni of a thickness of 10 nanometers, and Au of a thickness of 500 nanometers, is formed in the second photomask 17-removed portion by vacuum evaporation, sputtering, or the like, and the electrode 8n is alloyed. FIG. 7H illustrates this state.

Figure 7I:
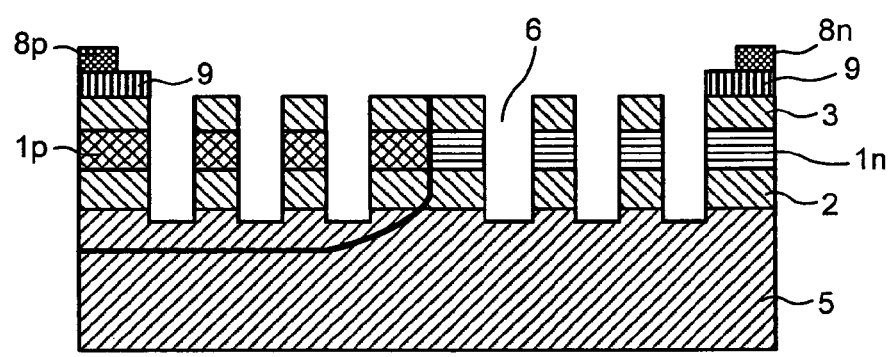
Figure 7J:
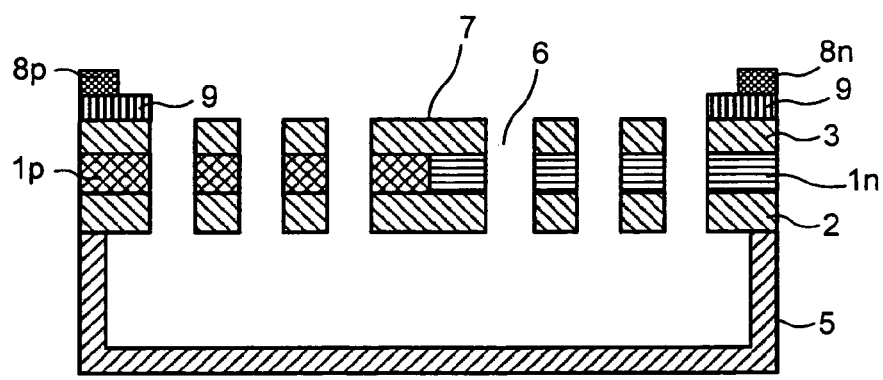

As shown in FIG. 7I, the second photomask 17 is removed and the ohmic contact layer 9 in portions other than those in which the electrodes 8p and 8n are formed is removed. As shown in FIG. 7J, only the substrate 5 in the lower portion of the two-dimensional periodic air hole structure 6 is selectively etched by wet etching, thereby obtaining the semiconductor device 10 in which the peripheral edge of the sheet-like slab layer 4 is supported by the peripheral edge of the substrate 5 the interior of which is hollow. Wirings necessary to drive the semiconductor device 10 are arranged by wire bonding or the like.

It is preferable to arrange the two electrodes 8p and 8n to be as proximate to each other as possible when attaching the electrodes 8p and 8n to the two-dimensional slab photonic crystal. However, if the electrodes 8p and 8n are provided near the waveguide 7, the ohmic contact layer 9 functions as the optical absorption layer. It is, therefore, necessary to provide the ohmic contact layer 9 to be away from the waveguide 7 to the extent that the ohmic contact layer 9 does not greatly absorb light. Conversely, if the two electrodes 8p and 8n are arranged to be away from each other, the periodic air hole structure 6 in the two-dimensional slab photonic crystal functions as a resistance against the injection current. It is, therefore, necessary to provide the electrodes 8p and 8n as proximately as possible. Meanwhile, the two-dimensional periodic refractive index profile structure in the two-dimensional slab photonic crystal can sufficiently confine light into the waveguide 7 by forming the structure in a range of about minus and plus ten micrometers from the waveguide 7 in a horizontal direction. If a distance between the portions of the ohmic contact layers 9 (i.e., between the electrodes 8p and 8n) exceeds 20 micrometers, an electric resistance becomes too high, with the result that injection power cannot effectively contribute to lasing and is consumed by heat emission more largely. It is, therefore, preferable that at the step shown in FIG. 7I, the ohmic contact layer 9 within the range of plus and minus ten micrometers from the waveguide 7 in the direction orthogonal to the extension direction of the waveguide 7 is removed in the parallel direction to the extension direction of the waveguide 7 based on the alignment mark added onto the surface of the substrate 5 during the formation of the pn junction. A removal width of the ohmic contact layer 9 may be further narrowed within an allowable range of optical absorption. This can reduce loss caused by the electric resistance (i.e., lasing efficiency can be improved). At this moment, the ohmic contact layer 9 is often formed so as to overlap the air hole structure 6. If so, the ohmic contact layer 9 can be removed with high accuracy.

The instance in which the periodic air hole structure 6 is processed after forming the pn junction has been explained. This is intended to prevent the pattern for forming the air hole structure 6 from being deformed.

The method of manufacturing the semiconductor device 60 explained above is only an example. Any other know method may be used to manufacture the semiconductor device 60. The instance in which the periodic air hole structure 6 is formed after the pn junction is formed has been explained. Alternatively, for example, the semiconductor device 60 may be formed by forming the pattern for forming the periodic air hole structure 6 including the linear defect structure, adding the alignment mark to the position at which the center of the width of the linear defect can be identified, and then forming the pn junction based on the alignment mark.

According to the third embodiment, the ohmic contact layer 9 is formed between the slab layer 4 and the electrodes 8. It is, therefore, advantageously possible to carry an ohmic current between the slab layer 4 and the electrodes 8.

Further, since the periodic air hole structure 6 is processed after the pn junction is formed, it is possible to prevent the air hole structure 6 from being deformed. During the formation of the pn junction, the alignment mark that can identify the pn junction section is formed and the periodic air hole structure 6 including the defect structure is formed based on the alignment mark. It is, therefore, possible to control alignment between the air hole structure 6 and the pn junction section with high accuracy. After each electrode 8 is formed, the interior of the substrate 5 is undercut by wet etching to thereby form a slab. Therefore, the probability of damaging the thin slab during the electrode formation process can be advantageously avoided. In the third embodiment, a layer formed between the lower cladding layer 2 and the substrate 5 has not been explained at all. However, if a layer of any structure such as another ohmic contact layer or a buffer layer intended to improve flatness is formed therebetween, it is possible to improve a degree of freedom for later electrode formation and improve crystal quality. In the third embodiment, the p-type dopant is doped by diffusing Zn. Alternatively, if the p-type dopant and the n-type dopant are employed oppositely for ion injection, epitaxial states before diffusion and injection, and the dopants to be diffused and injected, the semiconductor device 60 can exhibit the same advantages. In the third embodiment, similarly to the preceding embodiments, the step of forming the dielectric supported or semiconductor supported structure instead of forming the hollow slab can be applied.

Figure 8:
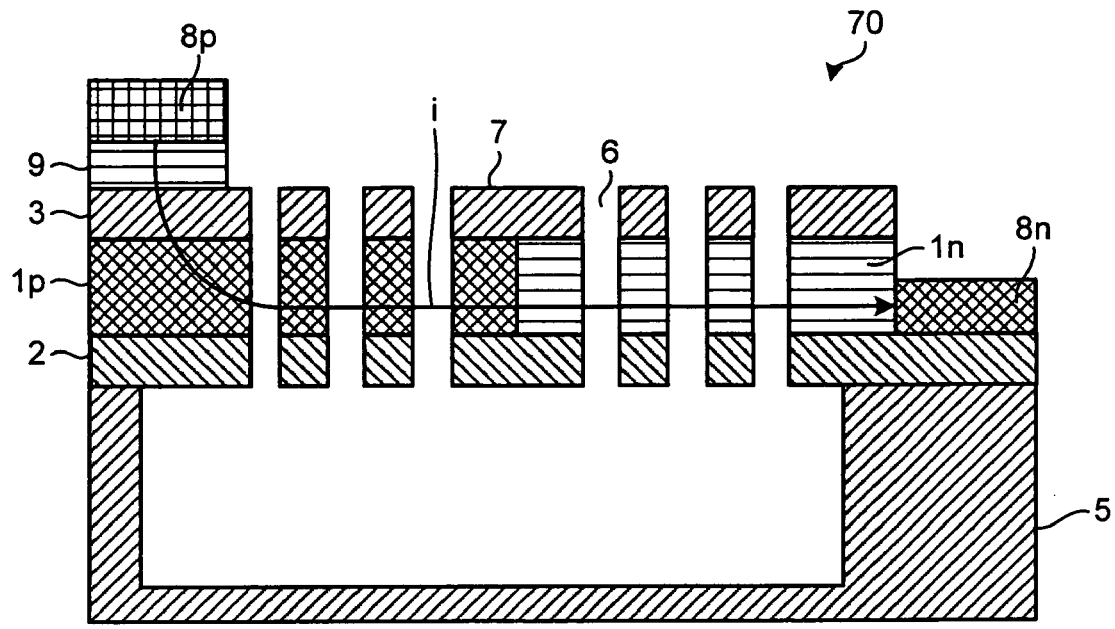
FIG. 8 to FIG. 10 are cross-sectional views of a semiconductor device according to a fourth embodiment of the present invention.
Figure 9:
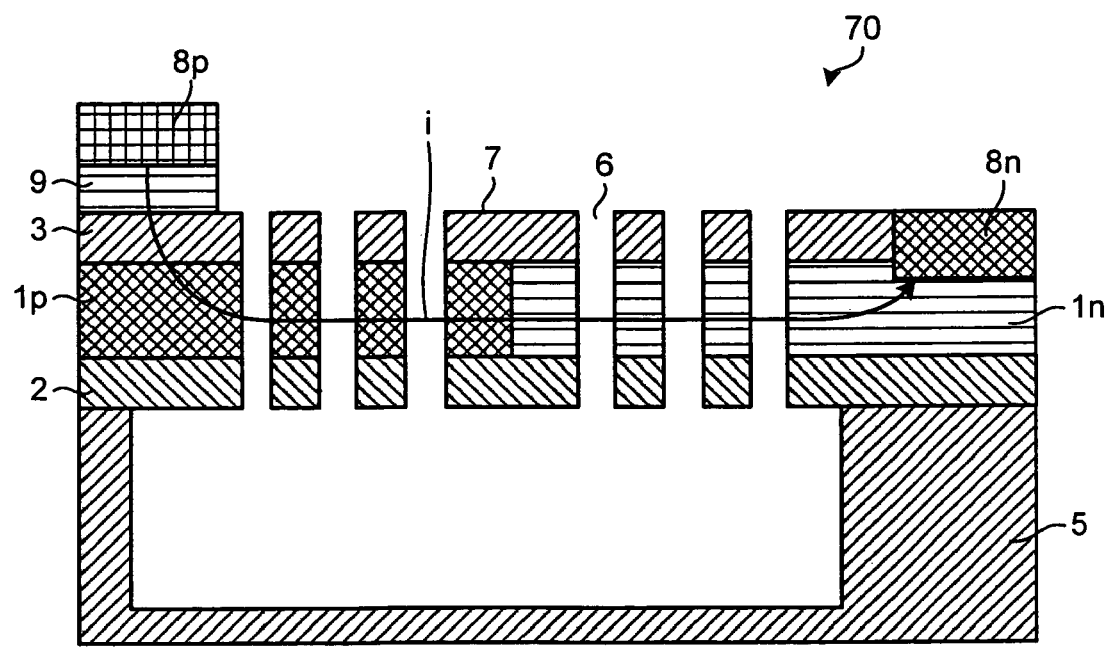
Figure 10:
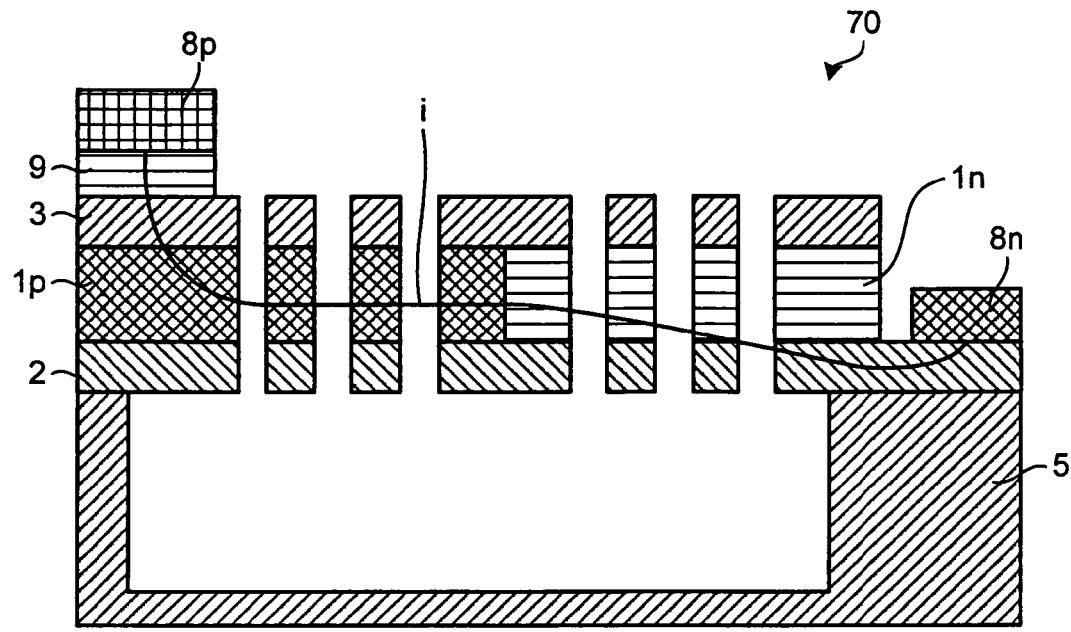

FIG. 8 to FIG. 10 are cross-sectional views of a semiconductor device 70 according to a fourth embodiment of the present invention. The semiconductor device 70 is characterized in that a position at which one of the electrodes 8 is attached is set lower than the upper cladding layer 3.

As shown in FIG. 8, the lower cladding layer 2 in a region in which one electrode 8n is formed is exposed, that is, the lower cladding layer 2 is exposed while providing a stepped portion so that the region in which the electrode 8n is formed is lower than the other regions. The electrode 8n is formed on the lower cladding layer 2 thus exposed. One side surface of the electrode 8n formed at this step is in contact with the active layer 1. The stepped portion can be formed by the dry etching system such as the ICP or RIE system. In this instance, if the active layer 1 is doped with the p-type dopant and the n-type dopant, and if one of or both of the p-type region 1p-side upper cladding layer 3 and the n-type region 1n-side lower cladding layer 2 are similarly doped with the p-type dopant and the n-type dopant, respectively, (that is, if one of or both of the upper and lower cladding layers 2 and 3 are doped), then the current can be efficiently carried to the pn junction section in the active layer 1 and efficient lasing can be realized. Besides, if only the active layer 1 is doped with the p-type dopant and the n-type dopant, more efficient lasing can be realized.

FIG. 9 illustrates that the stepped portion is formed up to the region of the active layer 1 without exposing the lower cladding layer 2 as shown in FIG. 8, and that the electrode 8n is formed on the partially exposed active layer 1. In the instance shown in FIG. 9, similarly to the instance shown in FIG. 8, one side surface of the electrode 8n thus formed is in contact with the active layer 1. In this instance, if the active layer 1 is doped with the p-type dopant and the n-type dopant, and if one of or both of the p-type region 1p-side upper cladding layer 3 and the n-type region 1n-side lower cladding layer 2 are similarly doped with the p-type dopant and the n-type dopant, respectively, (that is, if one of or both of the upper and lower cladding layers 2 and 3 are doped), then the current can be efficiently carried to the pn junction section in the active layer 1 and efficient lasing can be realized. Besides, if only the active layer 1 is doped with the p-type dopant and the n-type dopant, more efficient lasing can be realized.

FIG. 8 and FIG. 9 illustrate the configurations in which one side surface of the electrode 8n is in contact with the active layer 1. However, it is difficult to control an electrode formation state with these configurations. Therefore, as shown in FIG. 10, instead of bringing one side surface of the electrode 8n into contact with the active layer 1, a surface of the electrode 8n substantially horizontal to the surfaces of the stacked layers in the slab layer 4 may be brought into contact with the lower cladding layer 2. By doing so, the electrode 8n is formed in the stepped portion formed by dry etching so that the side surface of the electrode 8n is out of contact with the active layer 1. While FIG. 10 illustrates the instance in which the horizontal surface of the electrode 8n is in contact with the lower cladding layer 2, the horizontal surface thereof may be in contact with the active layer 1. In this instance, if the active layer 1 is doped with the p-type dopant and the n-type dopant, and if one of or both of the p-type region 1p-side upper cladding layer 3 and the n-type region 1n-side lower cladding layer 2 are similarly doped with the p-type dopant and the n-type dopant, respectively, (that is, if one of or both of the upper and lower cladding layers 2 and 3 are doped), then the current can be efficiently carried to the pn junction section in the active layer 1 and efficient lasing can be realized. Besides, if only the active layer 1 is doped with the p-type dopant and the n-type dopant, more efficient lasing can be realized.

While FIG. 8 to FIG. 10 illustrate that the electrode 8n is directly formed on the active layer 1 or the lower cladding layer 2, the ohmic contact layer 9 may be formed at the position at which the stepped portion is formed and the electrode 8n may be formed on the stepped portion as explained in the third embodiment.

According to the fourth embodiment, the semiconductor device 70 is constituted so that the position at which one of the electrodes 8 is formed is set lower than the upper cladding layer 3. It is, therefore, possible to control a current path and efficiently inject the current into the pn junction section in the active layer 1. In the fourth embodiment, even if the p-type dopant and the n-type dopant are oppositely doped, the semiconductor device 10 can exhibit the same advantages.

Figure 11:
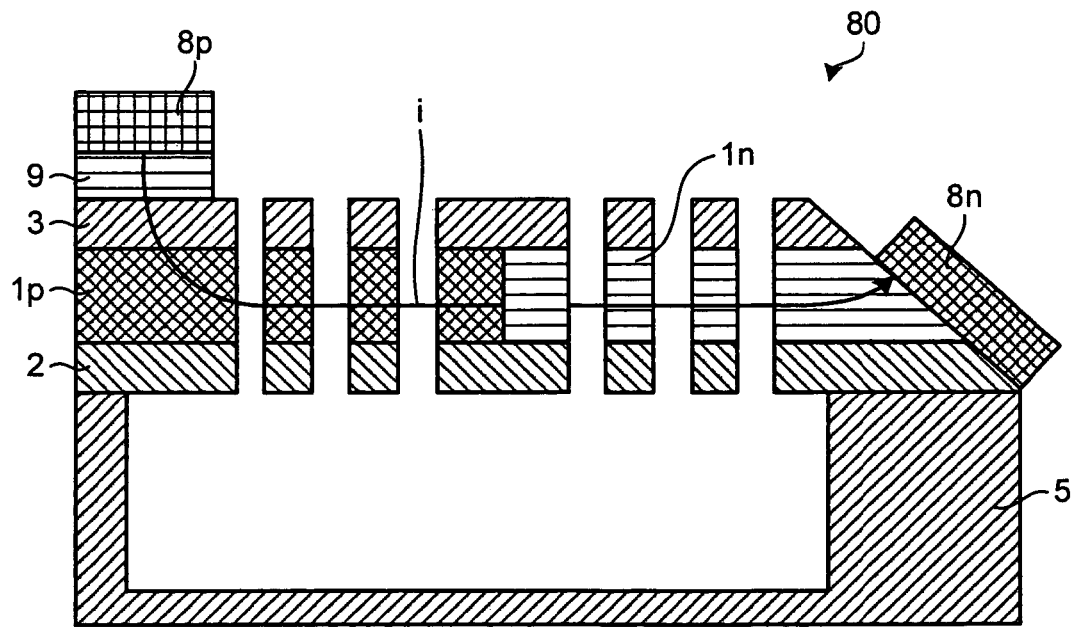
FIG. 11 and FIG. 12 are cross-sectional views of a semiconductor device according to a fifth embodiment of the present invention.
Figure 12:
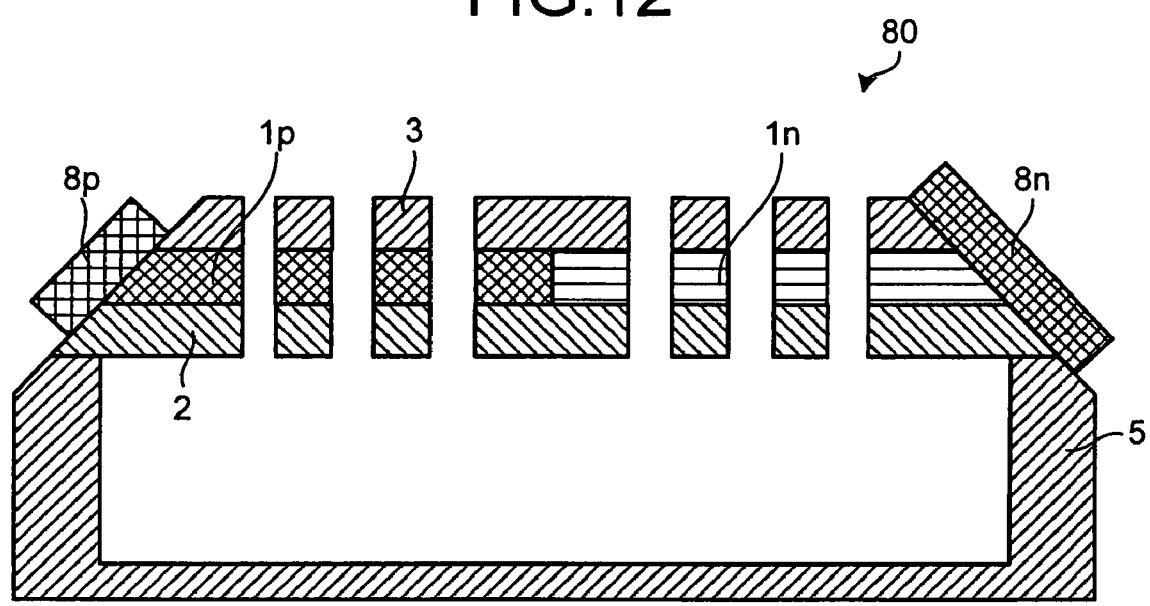

FIG. 11 and FIG. 12 are cross-sectional views of a semiconductor device 80 according to a fifth embodiment of the present invention. As shown in FIG. 11, the semiconductor device 80 is characterized in that electrode formation portions are formed aslant relative to the horizontal direction by anisotropic etching using crystal orientation.

For example, if InP having the same structure as that of InGaAsP is used as a material, it is known that a crystal orientation [001] is faster in etching rate than a crystal orientation [011]. Therefore, if the slab layer 4 is epitaxially grown so that a surface (001) is in parallel to the surface of the substrate 5 and subjected to wet etching, the surface (001) can be exposed to the end portions of the slab layer 4 as shown in FIG. 11. The electrode 8n can be attached to a portion including the active layer 1 in the exposed region. Therefore, by thus forming each electrode formation portion to have a predetermined angle with respect to the surfaces of the stacked layers in the slab layer 4 and attaching each electrode 8 to the electrode formation portion, a good contact interface can be obtained. In this instance, if the active layer 1 is doped with the p-type dopant and the n-type dopant, and if one of or both of the p-type region 1p-side upper cladding layer 3 and the n-type region 1n-side lower cladding layer 2 are similarly doped with the p-type dopant and the n-type dopant, respectively, (that is, if one of or both of the upper and lower cladding layers 2 and 3 are doped), then the current can be efficiently carried to the pn junction section in the active layer 1 and efficient lasing can be realized. Besides, if only the active layer 1 is doped with the p-type dopant and the n-type dopant, more efficient lasing can be realized.

The crystal orientation relationship is only one example. If the crystal is subjected to anisotropic etching, the slab layer 4 can be grown so that a surface having a higher etching rate is aslant at a predetermined angle with respect to the surface of the substrate 5.

FIG. 11 illustrates that the electrode 8n is brought into contact with the active layer 1 and the lower cladding layer 2 while making the electrode 8n out of contact only with the upper cladding layer 3. Alternatively, the electrode 8n may be brought into contact only with the lower cladding layer 2 while making the electrode 8n out of contact with both the upper cladding layer 3 and the active layer 1. If so, as explained in the third embodiment, the ohmic contact layer 9 may be provided between the electrode 8n and the slab layer 4. In this instance, if the active layer 1 is doped with the p-type dopant and the n-type dopant, and if one of or both of the p-type region 1p-side upper cladding layer 3 and the n-type region 1n-side lower cladding layer 2 are similarly doped with the p-type dopant and the n-type dopant, respectively, (that is, if one of or both of the upper and lower cladding layers 2 and 3 are doped), then the current can be efficiently carried to the pn junction section in the active layer 1 and efficient lasing can be realized. Besides, if only the active layer 1 is doped with the p-type dopant and the n-type dopant, more efficient lasing can be realized.

FIG. 11 illustrates that only the electrode 8n provided on one side of the semiconductor device 80 is subjected to anisotropic etching. Alternatively, the electrodes 8n and 8p on both sides thereof may be subjected to anisotropic etching as shown in FIG. 12. In this instance, if the active layer 1 is doped with the p-type dopant and the n-type dopant, and if one of or both of the p-type region 1p-side upper cladding layer 3 and the n-type region 1n-side lower cladding layer 2 are similarly doped with the p-type dopant and the n-type dopant, respectively, (that is, if one of or both of the upper and lower cladding layers 2 and 3 are doped), then the current can be efficiently carried to the pn junction section in the active layer 1 and efficient lasing can be realized. Besides, if only the active layer 1 is doped with the p-type dopant and the n-type dopant, more efficient lasing can be realized. If so, it suffices that each of the electrodes 8p and 8n is in contact with one of the active layer 1 and the upper and lower cladding layers 2 and 3.

According to the fifth embodiment, the semiconductor device 80 is constituted so that the slab layer 4 is subjected to wet etching so as to expose the surface aslant at the predetermined angle with respect to the surfaces of the stacked layers in the slab layer 4 using the anisotropy of the material for the slab layer 4 during wet etching, and each electrode 8 is formed on the exposed surface. Therefore, it is advantageously possible to obtain the good contact interface between the electrode 8 and the active layer 1 or between the electrode 8 and the lower cladding layer 2.

According to the present invention, it is possible to carry a current for pumping the active layer in a direction parallel to the surfaces of the stacked layers in the slab layer. Accordingly, if the semiconductor device is employed as an active device, it is also advantageously possible to make the device small in size as compared with the conventional device which is unavoidably made large in size because the active layer can be pumped only by optical pumping.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device comprising:
    forming a slab layer on a substrate by sequentially stacking a lower cladding layer, an active layer, and an upper cladding layer as stacked layers;
    forming a pn junction surface at a predetermined angle with respect to surfaces of the stacked layers in the slab layer;
    forming an ohmic contact layer for attaching an electrode, on the upper cladding layer;
    forming a periodic air hole structure introducing a linear defect region serving as a waveguide, on the slab layer and the ohmic contact layer;
    forming the electrode on the ohmic contact layer in each of a p-type region and an n-type region in the slab layer;
    removing the ohmic contact layer; and
    removing an interior portion of the substrate, so the substrate is hollow, to form the sheet-like slab layer.

2. The method according to claim 1, including
    forming each of the active layer and the upper and lower cladding layers of n-type compound semiconductor materials, and
    forming the pn junction surface by diffusing a dopant producing p-type conductivity into a predetermined region of the slab layer.

3. The method according to claim 1, including
    forming each of the active layer and the upper and lower cladding layers of p-type compound semiconductor materials, and
    forming the pn junction surface by diffusing a dopant producing n-type conductivity into a predetermined region of the slab layer.

4. The method according to claim 1, wherein
forming a pn junction surface includes forming an alignment mark on the slab layer that indicates position of the pn junction, and
removing the ohmic contact layer includes removing the ohmic contact layer in a predetermined region based on the alignment mark.

5. The method according to claim 1, wherein
forming a pn junction surface includes forming an alignment mark on the slab layer that indicates position of the pn junction, and
forming the periodic air hole structure includes matching position of the periodic air hole structure with the alignment mark when forming the periodic air hole structure.

6. The method according to claim 1, including forming the pn junction surface before forming the ohmic contact layer.

7. The method according to claim 1, including forming the pn junction surface after forming the ohmic contact layer.

8. The method according to claim 1, including forming the periodic air hole structure before removing the ohmic contact layer.

9. The method according to claim 1, wherein including forming the periodic air hole structure after removing the ohmic contact layer.

* * * * *

UNITED STATES PATENT AND TRADEMARK OFFICE
CERTIFICATE OF CORRECTION

| | | |
|---|---|---|
| PATENT NO. | : 7,390,683 B2 | Page 1 of 1 |
| APPLICATION NO. | : 11/375016 | |
| DATED | : June 24, 2008 | |
| INVENTOR(S) | : Sugitatsu et al. | |

It is certified that error appears in the above-identified patent and that said Letters Patent is hereby corrected as shown below:

On the Title Page
Item-[30] Change "2003-279587" to --2003-279857--.

Signed and Sealed this

Ninth Day of September, 2008

JON W. DUDAS
*Director of the United States Patent and Trademark Office*